(12) United States Patent  
Chen et al.

(10) Patent No.: US 12,402,367 B2  
(45) Date of Patent: Aug. 26, 2025

(54) SEMICONDUCTOR STRUCTURE AND MANUFACTURING METHOD THEREOF

(71) Applicant: United Microelectronics Corp., Hsinchu (TW)

(72) Inventors: Kuang-Hsiu Chen, Tainan (TW); Wei-Chung Sun, Tainan (TW); Chao Nan Chen, Tainan (TW); Chun-Wei Yu, Tainan (TW); Kuan Hsuan Ku, Tainan (TW); Shao-Wei Wang, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 514 days.

(21) Appl. No.: 17/835,977

(22) Filed: Jun. 9, 2022

(65) Prior Publication Data

US 2023/0369460 A1   Nov. 16, 2023

(30) Foreign Application Priority Data

May 12, 2022  (TW) .................................. 111117809

(51) Int. Cl.  
*H10D 62/00* (2025.01)  
*H01L 21/02* (2006.01)  
(Continued)

(52) U.S. Cl.  
CPC ..... *H10D 62/021* (2025.01); *H01L 21/02057* (2013.01); *H10D 30/01* (2025.01);  
(Continued)

(58) Field of Classification Search  
CPC .. H10D 62/021; H10D 30/01; H10D 30/0223; H10D 30/024; H10D 48/074;  
(Continued)

(56) References Cited

U.S. PATENT DOCUMENTS 8,404,546 B2   3/2013   Woon et al.  
8,486,587 B2   7/2013   Tsai et al.  
(Continued)

FOREIGN PATENT DOCUMENTS

CN   114141610 A  *  3/2022  
KR   102354014 B1  *  1/2022  
TW   202139356       10/2021

OTHER PUBLICATIONS

"Office Action of Taiwan Counterpart Application", issued on May 27, 2025, p. 1-p. 5.

*Primary Examiner* — Britt D Hanley  
*Assistant Examiner* — Jason James Greaving  
(74) *Attorney, Agent, or Firm* — JCIPRNET

(57) ABSTRACT

Provided are a semiconductor structure and a manufacturing method thereof. The manufacturing method of the semiconductor structure includes the following. A gate structure is formed on a substrate. A tilt implanting process is performed to implant group IV elements into the substrate to form a doped region, and the doped region is located on two sides of the gate structure and partially located under the gate structure. A part of the substrate on two sides of the gate structure is removed to form a first recess. A cleaning process is performed on the surface of the first recess. A wet etching process is performed on the first recess to form a second recess. A semiconductor layer is formed in the second recess.

14 Claims, 10 Drawing Sheets

(51) Int. Cl.
*H10D 30/01* (2025.01)
*H10D 30/69* (2025.01)

(52) U.S. Cl.
CPC ....... *H10D 30/0223* (2025.01); *H10D 30/024* (2025.01); *H10D 30/797* (2025.01)

(58) Field of Classification Search
CPC ................ H10D 84/144; H10D 84/903; H01L 21/02057; H01L 21/26506; H01L 21/26586; H01L 21/30608
See application file for complete search history.

(56) References Cited

U.S. PATENT DOCUMENTS

| | | | |
|---|---|---|---|
| 9,275,933 B2 | 3/2016 | Kuo et al. | |
| 9,748,139 B1 | 8/2017 | Liou et al. | |
| 9,761,791 B2 | 9/2017 | Shiu et al. | |
| 10,090,465 B2 | 10/2018 | Hsu et al. | |
| 2005/0285203 A1* | 12/2005 | Fukutome | H10D 62/151 |
| | | | 257/E21.336 |
| 2007/0090408 A1* | 4/2007 | Majumdar | H10D 30/62 |
| | | | 257/213 |
| 2012/0244674 A1* | 9/2012 | Kim | H01L 29/7848 |
| | | | 257/E21.441 |
| 2013/0045589 A1* | 2/2013 | Kim | H01L 29/66636 |
| | | | 438/514 |
| 2016/0254381 A1* | 9/2016 | Kwok | H01L 29/66636 |
| | | | 257/192 |
| 2022/0037465 A1* | 2/2022 | Lin | H10D 84/038 |

* cited by examiner

SEMICONDUCTOR STRUCTURE AND MANUFACTURING METHOD THEREOF

CROSS-REFERENCE TO RELATED APPLICATION

This application claims the priority benefit of Taiwan application serial no. 111117809, filed on May 12, 2022. The entirety of the above-mentioned patent application is hereby incorporated by reference herein and made a part of this specification.

BACKGROUND

Technical Field

The disclosure relates to a semiconductor structure and a manufacturing method thereof, and particularly relates to a semiconductor structure that has a recess with sidewalls having a Σ-shaped cross section and a manufacturing method thereof.

Description of Related Art

In the current manufacturing processes for a transistor that has epitaxial layers as the source and drain, generally after the gate structure is formed on the substrate, recesses are formed in the substrate on two sides of the gate structure, and then epitaxial layers are formed in the recesses by performing an epitaxial growth process. In the above processes, the profile shape of the formed recess corresponds to the profile shapes of the formed source and drain, which has a certain degree of influence on the electrical characteristics of the transistor.

SUMMARY

The disclosure provides a semiconductor structure that has a recess with sidewalls having a Σ-shaped cross section, in which an upper portion of the recess has an inclined surface, and the inclined surface has a convex shape or a concave shape.

The disclosure provides a manufacturing method of a semiconductor structure that implants a group IV element into a substrate to form a recess with sidewalls having a s-shaped cross section, in which an upper portion of the recess has an inclined surface, and the inclined surface has a convex shape or a concave shape.

A semiconductor structure according to the disclosure includes a gate structure and a semiconductor layer. The gate structure is disposed on a substrate. The semiconductor layer is disposed on two sides of the gate structure and located in a recess in the substrate. The semiconductor layer is partially located under the gate structure. The recess includes an upper portion and a lower portion. The upper portion has a first inclined surface and the lower portion has a second inclined surface. An angle between the first inclined surface and a bottom surface of the recess is an acute angle, and an angle between the second inclined surface and the bottom surface of the recess is an obtuse angle. The first inclined surface has a convex shape or a concave shape.

In an embodiment of the semiconductor structure according to the disclosure, a radius of curvature of the convex shape is 190 Å to 405 Å.

In an embodiment of the semiconductor structure according to the disclosure, a radius of curvature of the concave shape is 240 Å to 820 Å.

In an embodiment of the semiconductor structure according to the disclosure, a depth of the upper portion does not exceed 200 Å.

In an embodiment of the semiconductor structure according to the disclosure, the semiconductor layer includes a silicon germanium (SiGe) layer.

A manufacturing method of a semiconductor structure according to the disclosure includes the following. A gate structure is formed on a substrate. A tilt implanting process is performed to implant a group IV element into the substrate to form a doped region. The doped region is located on two sides of the gate structure and partially located under the gate structure. A part of the substrate on two sides of the gate structure is removed to form a first recess. A cleaning process is performed on a surface of the first recess. A wet etching process is performed on the first recess to form a second recess. A semiconductor layer is formed in the second recess.

In an embodiment of the manufacturing method of the semiconductor structure according to the disclosure, the group IV element includes carbon or germanium.

In an embodiment of the manufacturing method of the semiconductor structure according to the disclosure, a depth of the doped region does not exceed 200 Å.

In an embodiment of the manufacturing method of the semiconductor structure according to the disclosure, energy of the tilt implanting process is 1 KeV to 7 KeV.

In an embodiment of the manufacturing method of the semiconductor structure according to the disclosure, a forming method of the first recess includes the following. A first vertical etching process is performed to remove a part of the substrate to form a first preliminary recess. A lateral etching process is performed on the first preliminary recess to remove a part of the substrate to form a second preliminary recess. A second vertical etching process is performed on the second preliminary recess to remove a part of the substrate to form the first recess.

In an embodiment of the manufacturing method of the semiconductor structure according to the disclosure, a cross section of a sidewall of the first recess has a Σ shape.

In an embodiment of the manufacturing method of the semiconductor structure according to the disclosure, a cross section of a sidewall of the second recess has a Σ shape.

In an embodiment of the manufacturing method of the semiconductor structure according to the disclosure, the second recess includes an upper portion and a lower portion. The upper portion has a first inclined surface, and the lower portion has a second inclined surface. An angle between the first inclined surface and a bottom surface of the second recess is an acute angle, and an angle between the second inclined surface and the bottom surface of the second recess is an obtuse angle. The first inclined surface has a convex shape or a concave shape.

In an embodiment of the manufacturing method of the semiconductor structure according to the disclosure, the first inclined surface has the convex shape, and the cleaning process includes: a first cleaning process using ammonia water and hydrogen peroxide; and a second cleaning process using sulfuric acid and hydrogen peroxide.

In an embodiment of the manufacturing method of the semiconductor structure according to the disclosure, the first inclined surface has the concave shape, and the cleaning process includes: a first cleaning process using an aqueous solution containing carbon dioxide; and a second cleaning process using sulfuric acid and hydrogen peroxide.

In an embodiment of the manufacturing method of the semiconductor structure according to the disclosure, after the second cleaning process, the manufacturing method further includes a third cleaning process using ammonia water and hydrogen peroxide.

In an embodiment of the manufacturing method of the semiconductor structure according to the disclosure, a radius of curvature of the convex shape is 190 Å to 405 Å.

In an embodiment of the manufacturing method of the semiconductor structure according to the disclosure, a radius of curvature of the concave shape is 240 Å to 820 Å.

In an embodiment of the manufacturing method of the semiconductor structure according to the disclosure, the wet etching process includes: a first etching process using hydrofluoric acid; and a second etching process using tetramethyl ammonium hydroxide (TMAH).

Based on the above, according to the disclosure, the doped region containing the group IV element is formed in the substrate and partially located under the gate structure. Therefore, after cleaning the surface of the first recess by the cleaning process, the upper portion of the second recess formed by the subsequent wet etching process has a convex shape or a concave shape.

In order to make the above-mentioned and other features and advantages of the disclosure more comprehensible, exemplary embodiments are described in detail with reference to the accompanying drawings as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
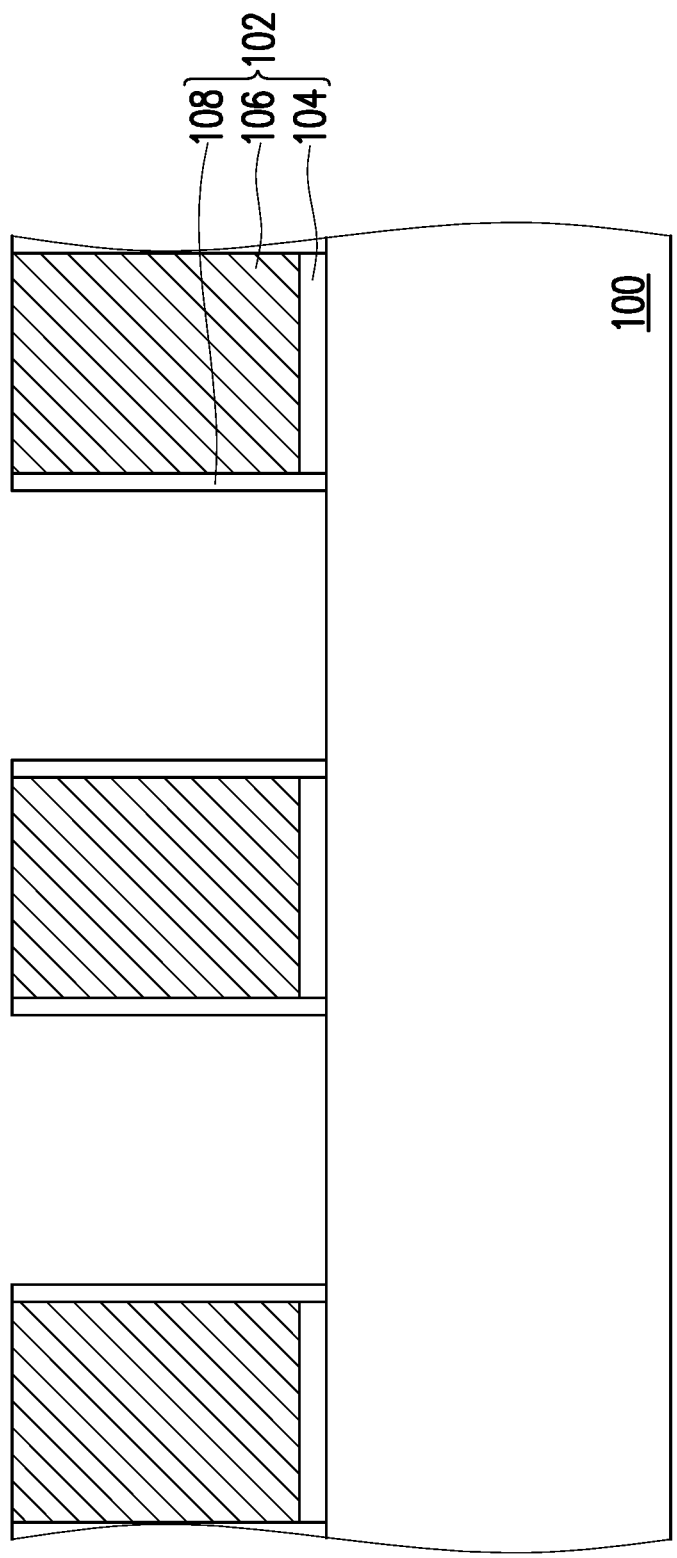
FIG. 1A to FIG. 1I are schematic cross-sectional views showing a manufacturing process of a semiconductor structure according to an embodiment of the disclosure.

Hereinafter, exemplary embodiments will be described in detail with reference to the accompanying drawings, but the provided embodiments are not intended to limit the scope of the disclosure. In addition, the drawings are for illustrative purposes only and may not be drawn to scale. In order to facilitate understanding of the disclosure, the same elements will be denoted by the same reference numerals in the following description.

Terms such as "containing," "including," "having," etc. used in this specification are all open-ended terms, that is, meaning "including but not limited to."

When terms such as "first," "second," etc. are used to describe the elements, they are only used to distinguish these elements from each other and are not intended to limit the order or importance of the elements. Therefore, in some cases, the first element may also be referred to as the second element, and the second element may also be referred to as the first element, without departing from the scope of the disclosure.

In addition, directional terms such as "up," "down," etc. used in this specification only refer to the directions of the drawings and are not intended to limit the disclosure. Thus, it should be understood that "up" is used interchangeably with "down" and that when an element such as a layer or a film is placed "on" another element, the element may be directly placed on another element or there may be an intervening element. However, when an element is described as being "directly" placed "on" another element, there is no other intervening element between the two elements.

Furthermore, a range expressed by "one value to another value" is a general expression to avoid listing all the values in that range in the specification. Thus, the recitation of a particular numerical range includes any value within that numerical range as well as any smaller numerical range defined by any values within that numerical range.

FIG. 1A to FIG. 1I are schematic cross-sectional views showing a manufacturing process of a semiconductor structure according to an embodiment of the disclosure. First, referring to FIG. 1A, a substrate 100 is provided. In this embodiment, the substrate 100 is, for example, a silicon substrate. Next, a gate structure 102 is formed on the substrate 100. In this embodiment, the gate structure 102 includes a gate dielectric layer 104, a gate 106, and a spacer 108, but the disclosure is not limited thereto. Specifically, in this embodiment, the gate 106 is disposed on the substrate 100, and the gate dielectric layer 104 is disposed between the gate 106 and the substrate 100. In addition, the spacer 108 is disposed on the sidewalls of the gate dielectric layer 104 and the gate 106. In FIG. 1A, for clarity, only three gate structures spaced apart from one another are shown, but the disclosure is not limited thereto. A method of forming the gate structure 102 is well known to those skilled in the art, and therefore will not be further described herein.

Figure 1B:
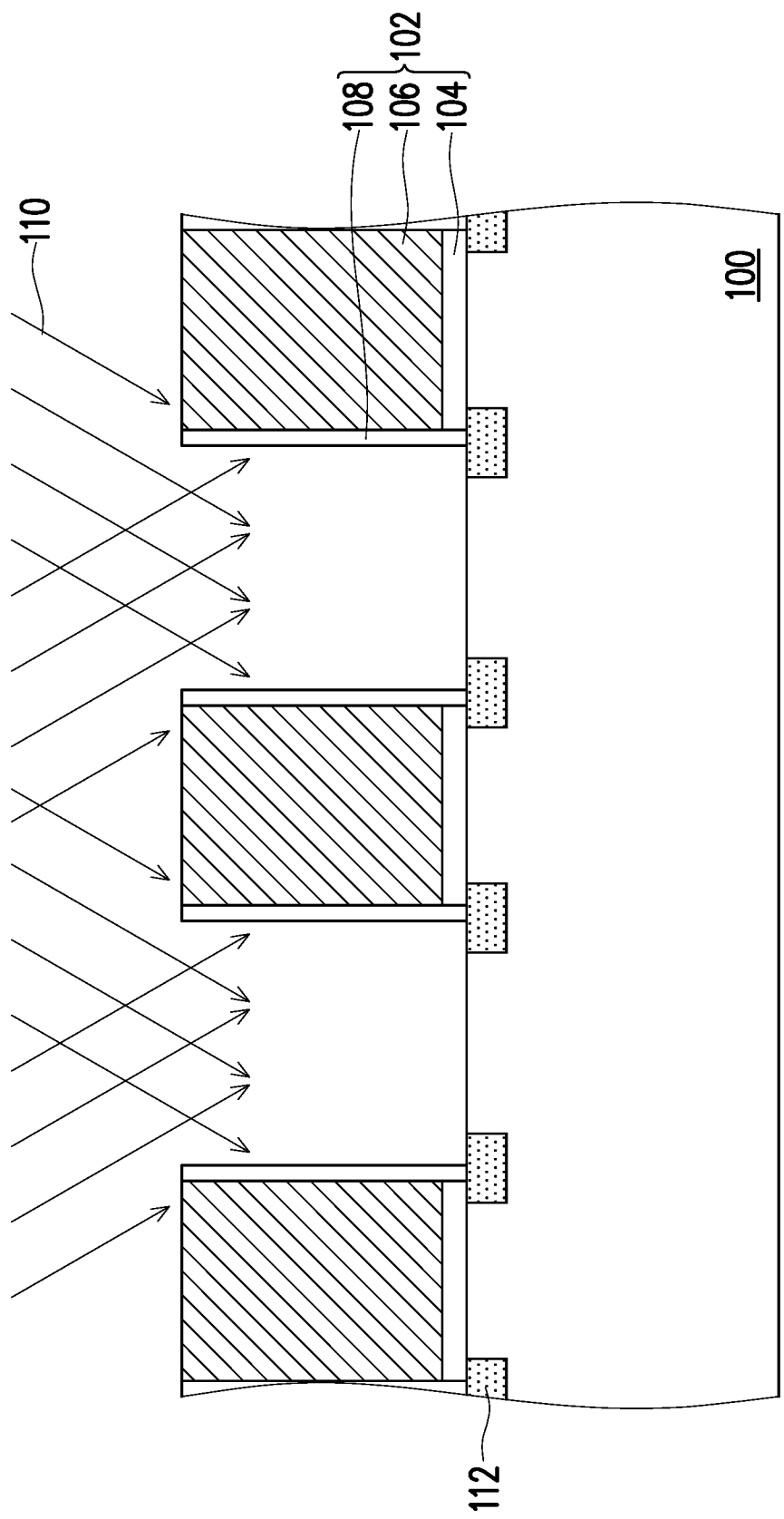

Then, referring to FIG. 1B, a tilt implanting process 110 is performed to implant a group IV element into the substrate 100 to form a doped region 112. The doped regions 112 are located on two sides of the gate structure 102. In this embodiment, a group IV element close to the lattice size of the material of the substrate 100 may be implanted into the substrate 100. For example, when the substrate 100 is a silicon substrate, carbon or germanium may be implanted into the substrate 100. In this embodiment, the tilt implanting process 110 is used to implant the group IV element into the substrate 100, so that a part of the formed doped region 112 may be located under the gate structure 102. That is, the doped region 112 is partially located under the gate structure 102. In addition, in this embodiment, the doped regions 112 located between two adjacent gate structures 102 are discontinuous, but the disclosure is not limited thereto. In other embodiments, depending on the implantation angle of the tilt implanting process 110, the doped regions 112 between two adjacent gate structures 102 may be continuous.

Depending on the energy of the tilt implanting process, the doped region 112 may have a desired depth. In this embodiment, the energy of the tilt implanting process is 1 KeV to 7 KeV, and the depth of the doped region 112 does not exceed 200 Å. The doped region 112 is used to control the shape of the trench subsequently formed in the substrate 100, which will be described hereinafter.

Figure 1C:
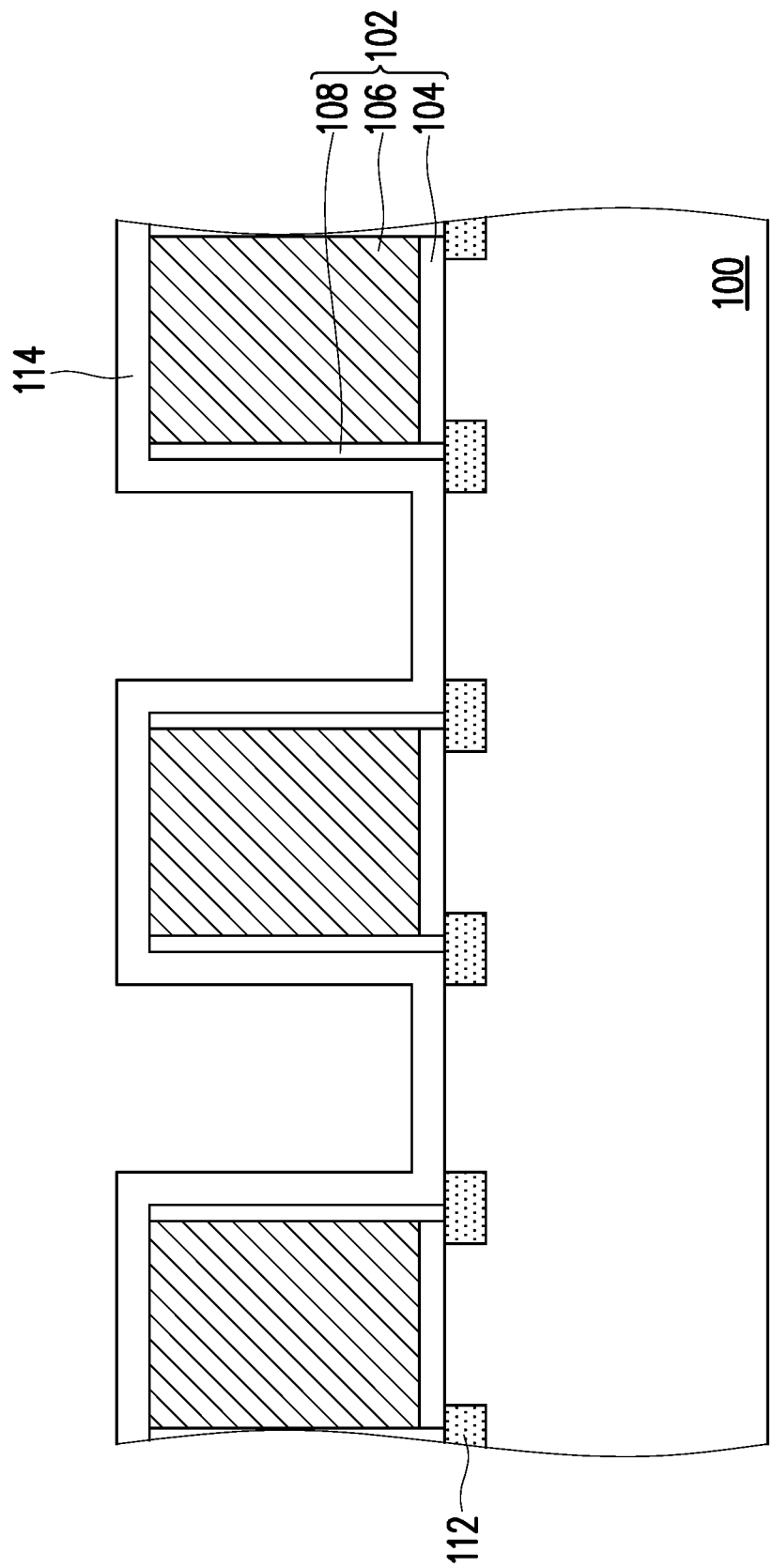

Next, referring to FIG. 1C, a spacer material layer 114 is conformally formed on the substrate 100. The spacer material layer 114 covers the substrate 100 and the gate structure 102. The spacer material layer 114 is, for example, a nitride layer. The spacer material layer 114 is used to form the spacer on the sidewalls of the gate structure 102 in the subsequent processes. In other embodiments, the formation of the spacer material layer 114 may be omitted depending on actual requirements.

Figure 1D:
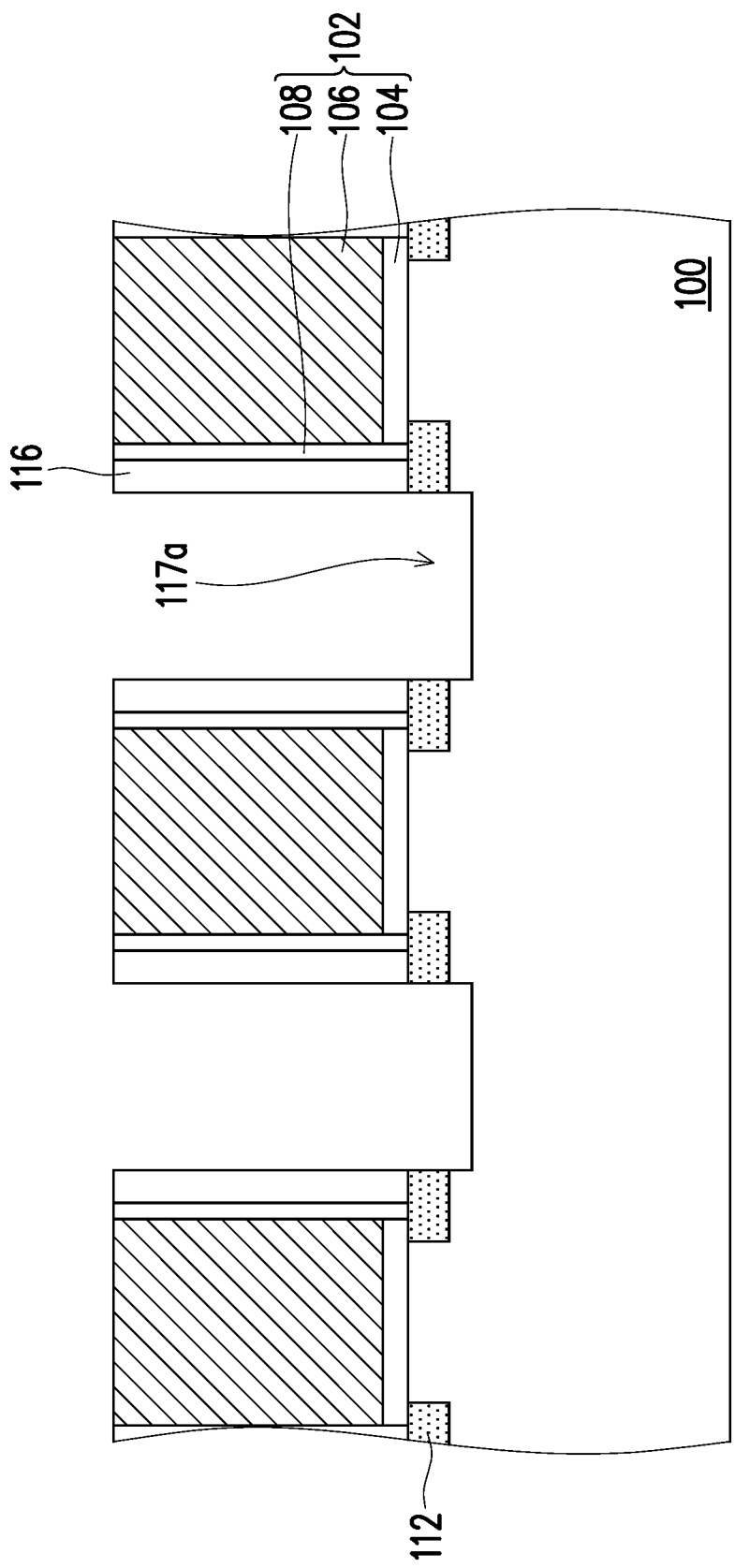
Figure 1E:
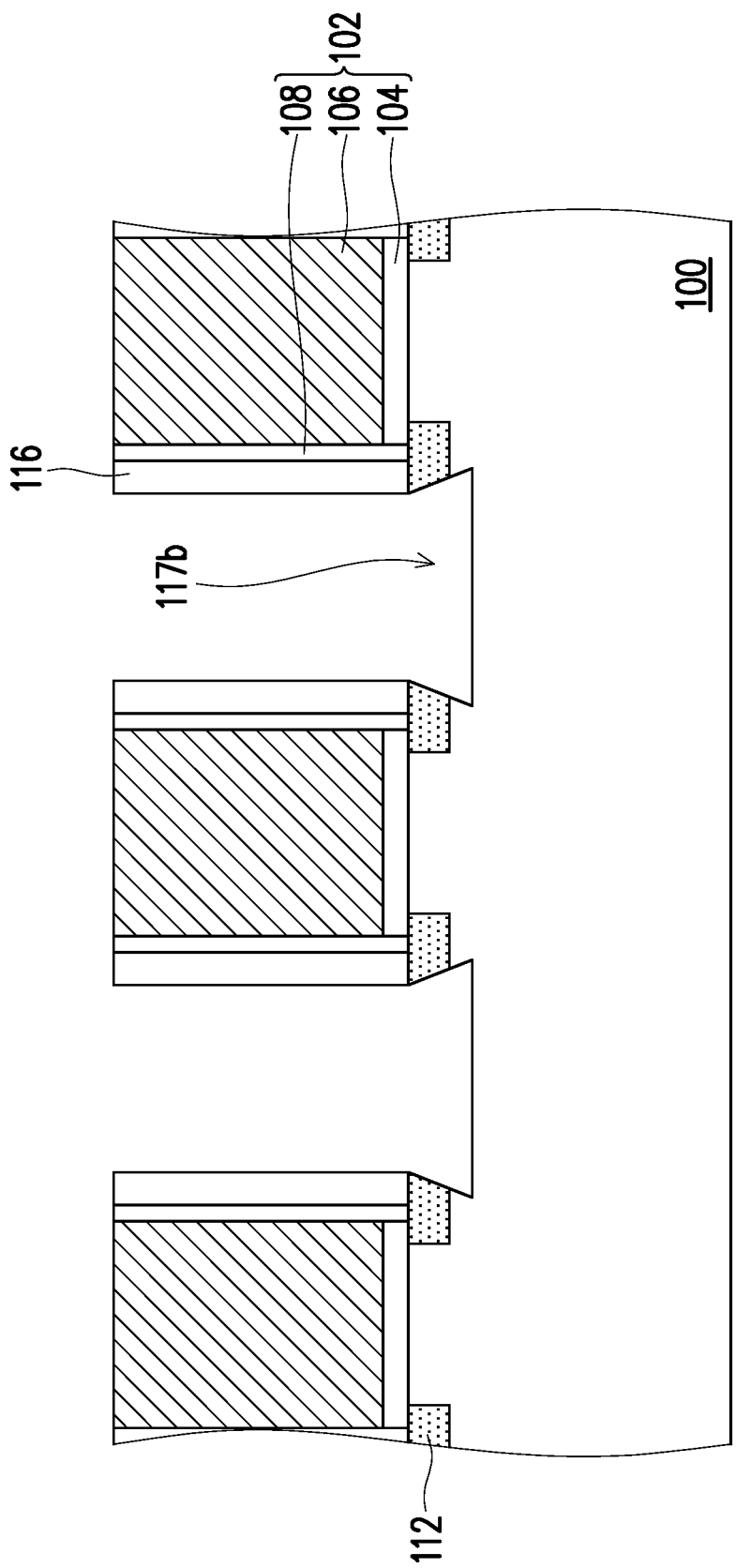
Figure 1F:
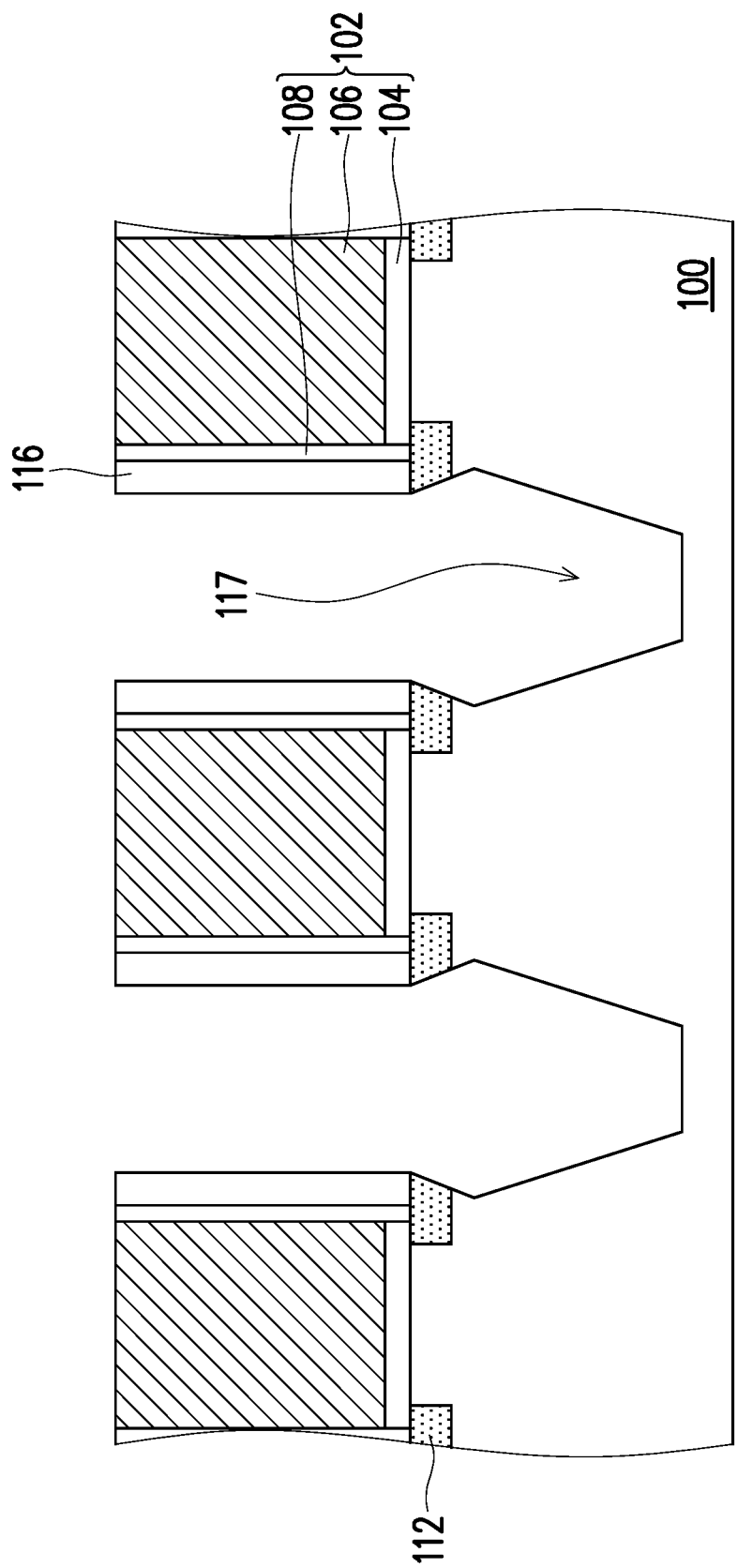

Then, referring to FIG. 1D, an anisotropic etching process is performed on the spacer material layer 114 to remove a part of the spacer material layer 114 to form spacers 116 on the sidewalls of the gate structure 102. Next, an etching process is performed to remove a part of the substrate 100 between two adjacent gate structures 102 to form a first recess 117 (as shown in FIG. 1F). In this embodiment, the cross section of the sidewall of the first recess 117 has a Σ shape.

In this embodiment, a method of forming the first recess 117 may include the following processes. First, after the spacers 116 are formed, a first vertical etching process is performed with the gate structure 102 and the spacers 116 as etching masks to remove a part of the substrate 100 to form a first preliminary recess 117a. In this embodiment, the first vertical etching process is, for example, a dry etching process. In this embodiment, the depth of the first preliminary recess 117a may not be less than the depth of the doped region 112. Next, referring to FIG. 1E, a lateral etching process is performed on the first preliminary recess 117a to remove a part of the substrate 100 to form a second preliminary recess 117b. In this embodiment, the lateral etching process is, for example, an isotropic etching process. Depending on the actual situation and requirements, the isotropic etching process may be a wet etching process or a dry etching process, which is not limited in the disclosure. Accordingly, the second preliminary recess 117b extends under the gate structure 102. That is, the width of the second preliminary recess 117b is greater than the width of the first preliminary recess 117a. In addition, in this embodiment, based on the characteristics of the isotropic etching process, the width of the second preliminary recess 117b gradually increases from the top to the bottom. Thereafter, referring to FIG. 1F, a second vertical etching process is performed on the second preliminary recess 117b to remove a part of the substrate 100 to form the first recess 117. The first recess 117 includes the second preliminary recess 117b and the recess formed by removing the substrate 100 in this process. Based on the depth of the recess and the characteristics of the dry etching process, the width of the recess formed by removing the substrate 100 in this process gradually decreases from the top to the bottom. As a result, the middle portion of the formed first recess 117 has a greater width than the other portions. That is, the cross section of the sidewall of the first recess 117 has a Σ shape.

Figure 1G:
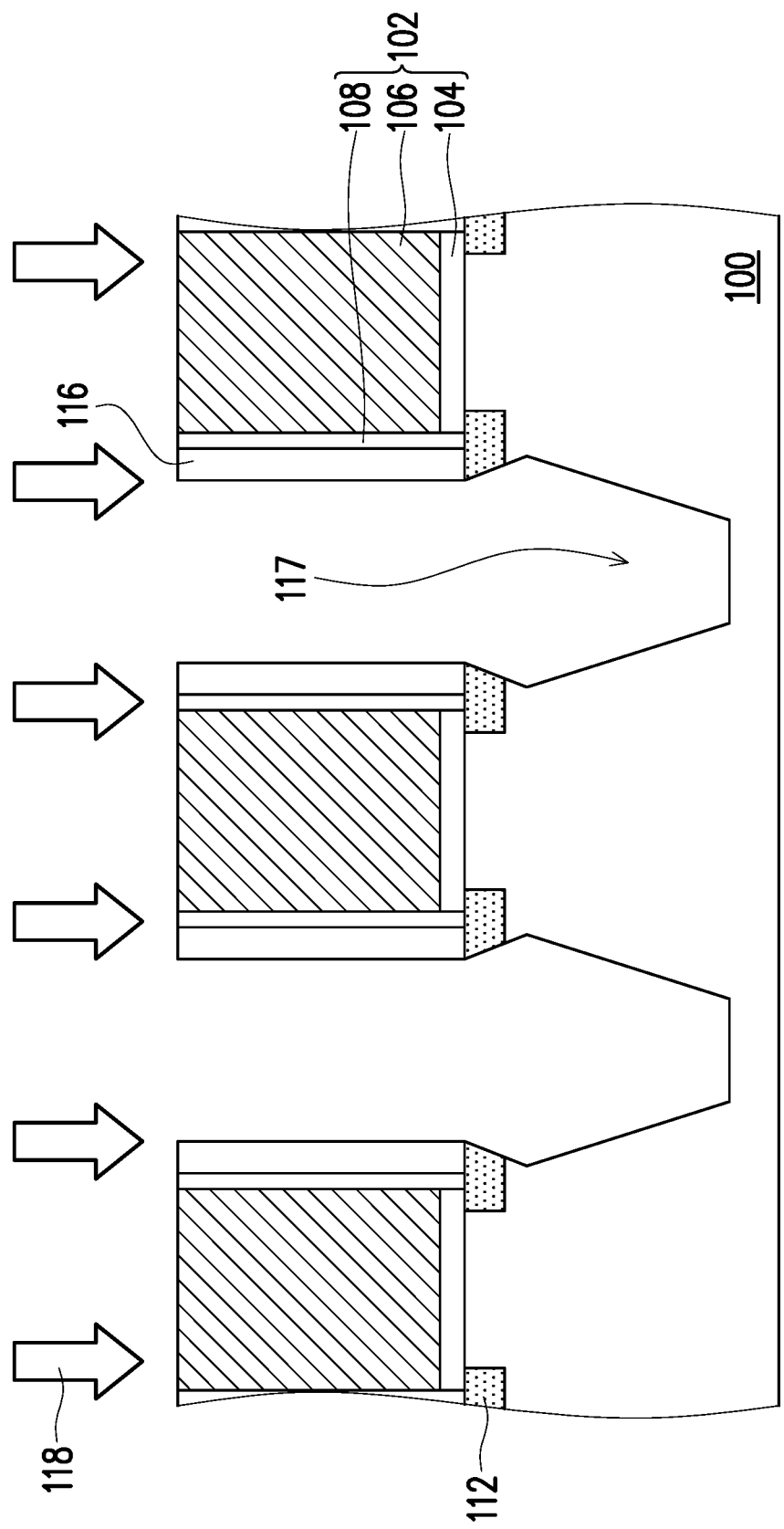

Next, referring to FIG. 1G, a cleaning process 118 is performed on the surface of the first recess 117. In this embodiment, the cleaning process 118 includes a first cleaning process using ammonia water and hydrogen peroxide and a second cleaning process using sulfuric acid and hydrogen peroxide. After the first cleaning process is performed, the first recess 117 has a relatively rough surface. During the second cleaning process, the surface of the first recess 117 may be oxidized. In addition, after the second cleaning process is performed, depending on actual requirements, a third cleaning process using ammonia water and hydrogen peroxide may be performed to further remove contaminants that may be generated on the surface of the first recess 117 during the second cleaning process.

Figure 1H:
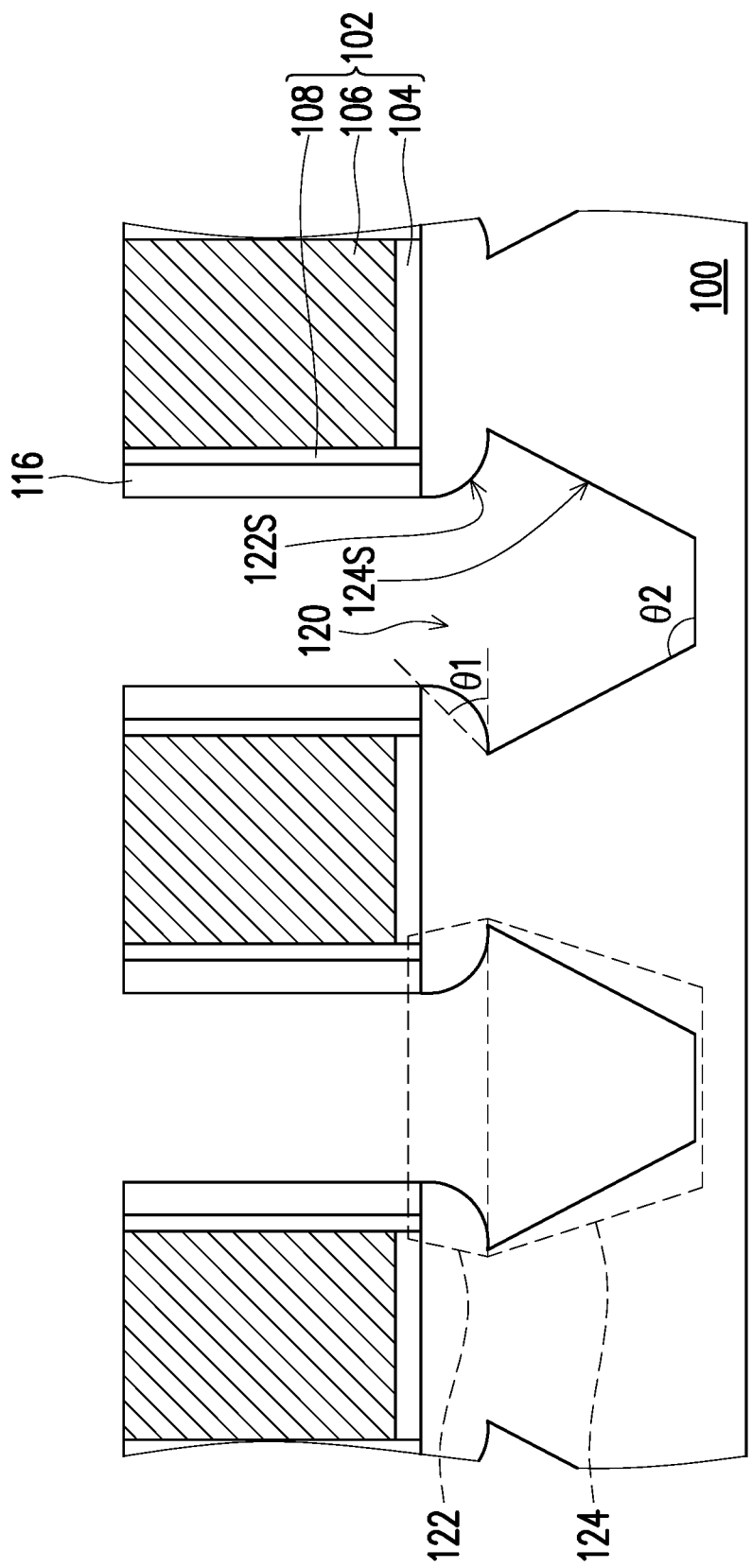

Then, referring to FIG. 1H, a wet etching process is performed on the first recess 117 to form a second recess 120. After the wet etching process is performed, based on the profile of the first recess 117, the cross section of the sidewall of the second recess 120 has a more obvious Σ shape. In this embodiment, a method of forming the second recess 120 may include the following processes. First, a first etching process using hydrofluoric acid is performed on the first recess 117. In this embodiment, diluted hydrofluoric acid (DHF) may be used. Then, a second etching process using tetramethyl ammonium hydroxide (TMAH) is performed. The time of the second etching process is, for example, 170 seconds to 300 seconds. In this embodiment, since the doped region 112 containing the group IV element is formed in the substrate 100 and is partially located under the gate structure 102, after the surface of the first recess 117 is cleaned by the cleaning process 118, the wet etching process including the first etching process and the second etching process not only removes a part of the substrate 100 to form the second recess 120 but also forms the upper portion of the second recess 120 into a convex shape, and a radius of curvature of the convex surface is 190 Å to 405 Å.

In detail, in this embodiment, the second recess 120 includes an upper portion 122 and a lower portion 124. The upper portion 122 has a first inclined surface 122S, and an angle θ1 between the first inclined surface 122S and a bottom surface of the second recess 120 is an acute angle. The lower portion 124 has a second inclined surface 124S, and an angle θ2 between the second inclined surface 124S and the bottom surface of the second recess 120 is an obtuse angle. That is to say, the cross section of the sidewall of the second recess 120 has a Σ shape. In addition, as described above, after the wet etching process including the first etching process and the second etching process is performed, the second recess 120 may have a greater width and a greater depth than the first recess 117, and the first inclined surface 122S of the second recess 120 may have a convex shape with a radius of curvature of 190 Å to 405 Å. That is, the first inclined surface 122S protrudes toward the inside of the second recess 120.

Figure 1I:
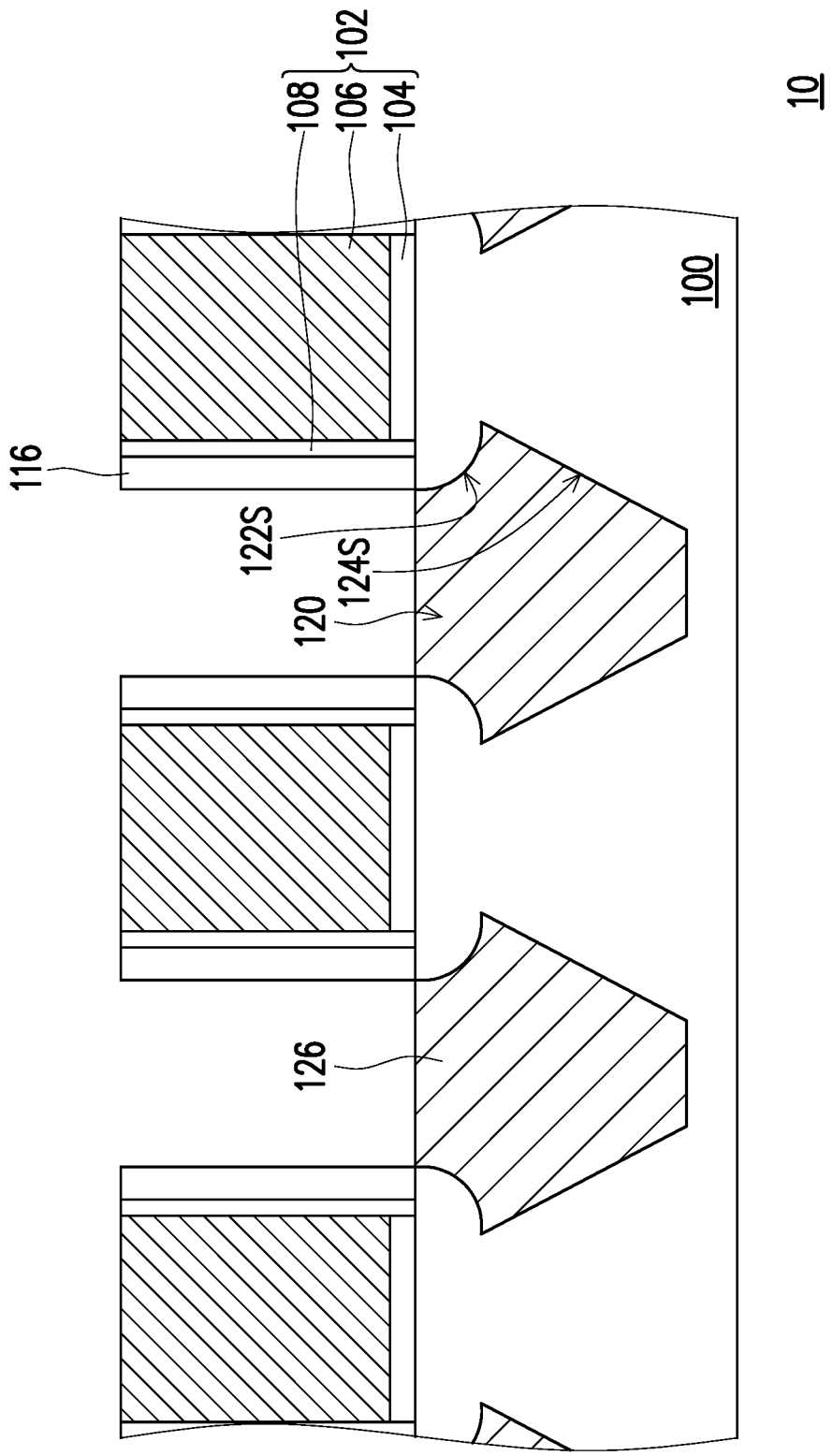

Thereafter, referring to FIG. 1I, a semiconductor layer 126 is formed in the second recess 120. In this embodiment, the semiconductor layer 126 is a silicon germanium layer, and a method of forming the semiconductor layer 126 includes, for example, performing an epitaxial growth process. Thereby, a semiconductor structure 10 of this embodiment is completed, and the semiconductor structure 10 of this embodiment is a transistor having epitaxial source and drain.

As shown in FIG. 1I, in the semiconductor structure 10 of this embodiment, the gate structure 102 is disposed on the substrate 100, and the semiconductor layers 126 are disposed in the substrate 100 on two sides of the gate structure 102 and are partially located under the gate structure 102. Since the first inclined surface 122S of the second recess 120 has a convex shape, there is a relatively large distance between the semiconductor layer 126 serving as the source and drain and the channel region of the transistor, which effectively reduces the parasitic capacitance generated during the operation of the transistor and effectively prevents the occurrence of current leakage.

In the above-described embodiment, the first inclined surface 122S of the second recess 120 has a convex shape, but the disclosure is not limited thereto. In other embodiments, the first inclined surface 122S of the second recess 120 may have a concave shape by adjusting the first cleaning process of the cleaning process 118, which will be described in detail below.

Figure 2:
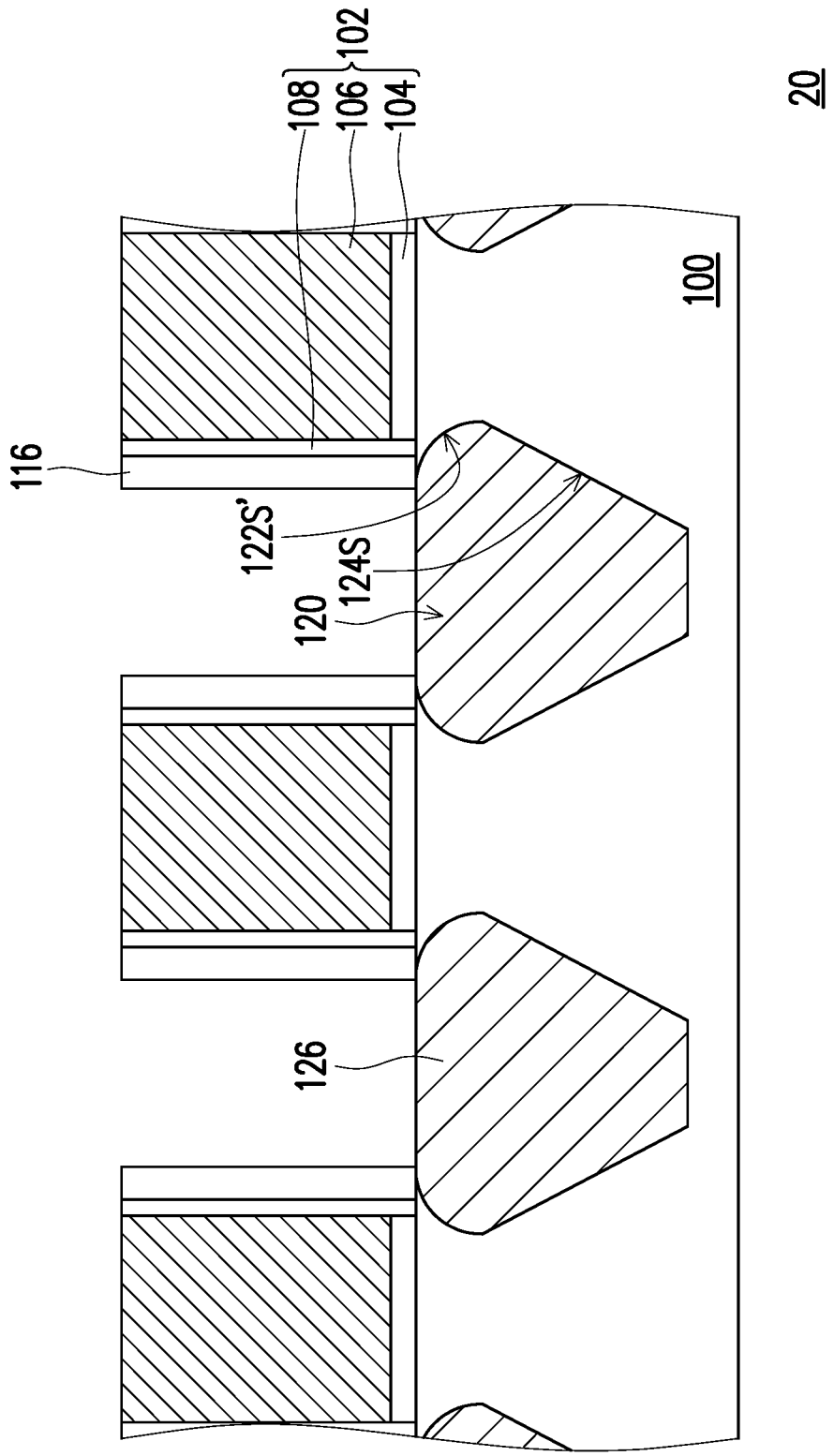
FIG. 2 is a schematic cross-sectional view of a semiconductor structure according to another embodiment of the disclosure.

FIG. 2 is a schematic cross-sectional view of a semiconductor structure according to another embodiment of the disclosure. In FIG. 2, the same elements as those in FIG. 1I will be denoted by the same reference numerals and will not be described again.

Referring to FIG. 2, in the semiconductor structure 20 of this embodiment, the first inclined surface 122S' of the second recess 120 has a concave shape. That is, the first inclined surface 122S' is recessed toward the inside of the substrate 100. In detail, in the process of FIG. 1G, when the cleaning process 118 is performed on the surface of the first recess 117, an aqueous solution containing carbon dioxide is used in place of the ammonia water and hydrogen peroxide in the first cleaning process. That is, in this embodiment, the cleaning process 118 includes a first cleaning process using the aqueous solution containing carbon dioxide and a second cleaning process using sulfuric acid and hydrogen peroxide. Therefore, after the first cleaning process is performed, the first recess 117 has a relatively smooth surface, so that a relatively thin and dense oxide layer may be formed on the surface of the first recess 117 during the second cleaning process. In addition, after the second cleaning process is performed, depending on actual requirements, a third cleaning process using ammonia water and hydrogen peroxide may be performed to further remove contaminants that may be generated on the surface of the first recess 117 during the second cleaning process. Accordingly, after the wet etching process shown in FIG. 1H is performed, besides that the cross section of the sidewall of the formed second recess 120 has a more obvious Σ shape, the first inclined surface 122S' of the second recess 120 has a concave shape, and the radius of curvature of the concave shape is 240 Å to 820 Å.

In the semiconductor structure 20 of this embodiment, since the first inclined surface 122S' of the second recess 120 has a concave shape, there is a relatively small distance between the semiconductor layer 126 serving as the source and drain and the channel region of the transistor. Therefore, during the operation of the transistor, the transistor may have a relatively high on current ($I_{on}$) under the same off current ($I_{off}$). Accordingly, the transistor has better performance.

Although the disclosure has been described with reference to the embodiments above, they are not intended to limit the disclosure. Those skilled in the art can make various changes and modifications without departing from the spirit and scope of the disclosure. Therefore, the scope of protection of the disclosure is defined by the following claims.

What is claimed is:

1. A manufacturing method of a semiconductor structure, comprising:
    forming a gate structure on a substrate;
    performing a tilt implanting process to implant a group IV element into the substrate to form a doped region, wherein the doped region is located on two sides of the gate structure and partially located under the gate structure;
    removing a part of the substrate on two sides of the gate structure to form a first recess;
    performing a cleaning process on a surface of the first recess;
    performing a wet etching process on the first recess to form a second recess; and
    forming a semiconductor layer in the second recess,
    wherein a forming method of the first recess comprises:
    performing a first vertical etching process to remove a part of the substrate to form a first preliminary recess;
    performing a lateral etching process on the first preliminary recess to remove a part of the substrate to form a second preliminary recess; and
    performing a second vertical etching process on the second preliminary recess to remove a part of the substrate to form the first recess.

2. The manufacturing method of the semiconductor structure according to claim 1, wherein the group IV element comprises carbon or germanium.

3. The manufacturing method of the semiconductor structure according to claim 1, wherein a depth of the doped region does not exceed 200 Å.

4. The manufacturing method of the semiconductor structure according to claim 1, wherein energy of the tilt implanting process is 1 KeV to 7 KeV.

5. The manufacturing method of the semiconductor structure according to claim 1, wherein a middle portion of the first recess has a greater width than other portions of the first recess.

6. The manufacturing method of the semiconductor structure according to claim 1, wherein a middle portion of the second recess has a greater width than other portions of the second recess.

7. The manufacturing method of the semiconductor structure according to claim 6, wherein the second recess comprises an upper portion and a lower portion, the upper portion has a first inclined surface, and the lower portion has a second inclined surface, wherein an angle between a projection of a line which passes through two endpoints of the first inclined surface and a projection of a linear extension of a bottom surface of the second recess is an acute angle, an angle between a projection of a line which passes through two endpoints of the second inclined surface and the projection of the linear extension of the bottom surface of the second recess is an obtuse angle, and the first inclined surface has a convex shape or a concave shape.

8. The manufacturing method of the semiconductor structure according to claim 7, wherein the first inclined surface has the convex shape, and the cleaning process comprises:
    a first cleaning process using ammonia water and hydrogen peroxide; and
    a second cleaning process using sulfuric acid and hydrogen peroxide.

9. The manufacturing method of the semiconductor structure according to claim 8, wherein after the second cleaning process, the manufacturing method further comprises a third cleaning process using ammonia water and hydrogen peroxide.

10. The manufacturing method of the semiconductor structure according to claim 7, wherein the first inclined surface has the concave shape, and the cleaning process comprises:
    a first cleaning process using an aqueous solution containing carbon dioxide; and
    a second cleaning process using sulfuric acid and hydrogen peroxide.

11. The manufacturing method of the semiconductor structure according to claim 10, wherein after the second cleaning process, the manufacturing method further comprises a third cleaning process using ammonia water and hydrogen peroxide.

12. The manufacturing method of the semiconductor structure according to claim 7, wherein a radius of curvature of the convex shape is 190 Å to 405 Å.

13. The manufacturing method of the semiconductor structure according to claim 7, wherein a radius of curvature of the concave shape is 240 Å to 820 Å.

14. The manufacturing method of the semiconductor structure according to claim 1, wherein the wet etching process comprises:
    a first etching process using hydrofluoric acid; and
    a second etching process using tetramethyl ammonium hydroxide.

* * * * *